United States Patent
Mankos et al.

(10) Patent No.: US 7,217,924 B1
(45) Date of Patent: May 15, 2007

(54) HOLEY MIRROR ARRANGEMENT FOR DUAL-ENERGY E-BEAM INSPECTOR

(75) Inventors: Marian Mankos, Palo Alto, CA (US); Eric Munro, London (GB)

(73) Assignee: KLA-Tencor Technologies Corporation, Milpitas, CA (US)

( * ) Notice: Subject to any disclaimer, the term of this patent is extended or adjusted under 35 U.S.C. 154(b) by 51 days.

(21) Appl. No.: 11/205,367

(22) Filed: Aug. 16, 2005

Related U.S. Application Data

(60) Provisional application No. 60/705,312, filed on Aug. 3, 2005.

(51) Int. Cl.
*H01J 37/26* (2006.01)
*G01N 23/225* (2006.01)

(52) U.S. Cl. .................. 250/310; 250/305; 250/311; 250/396 R; 250/396 ML; 250/492.3

(58) Field of Classification Search ................ 250/310
See application file for complete search history.

(56) References Cited

U.S. PATENT DOCUMENTS

| | | | |
|---|---|---|---|
| 4,564,758 A | 1/1986 | Slodzian et al. | |
| 5,444,242 A | 8/1995 | Larson et al. | |
| 6,586,733 B1 | 7/2003 | Veneklasen et al. | |
| 6,610,980 B2 | 8/2003 | Veneklasen et al. | |
| 6,803,571 B1 | 10/2004 | Mankos et al. | |
| 6,930,309 B1 * | 8/2005 | Mankos et al. | 250/310 |
| 2002/0070340 A1 * | 6/2002 | Veneklasen et al. | 250/310 |

FOREIGN PATENT DOCUMENTS

WO WO 01/88514 A1 11/2001

OTHER PUBLICATIONS

L. Veneklasen, "The Continuing Development of the Low-Energy Electron Microscope for Characterizing Surface", Dec. 1992, pp. 5513-5532, vol. 63, No. 12, Rev. Sci. Institute of Physics.
J. Chmelik, et al. "Comparing Cathode Lens Configurations for Low Energy Electron Microscopy", 1989, pp. 155-160, vol. 83, No. 5, OPTIK.

* cited by examiner

*Primary Examiner*—Nikita Wells
*Assistant Examiner*—Bernard Souw
(74) *Attorney, Agent, or Firm*—Okamoto & Benedicto LLP

(57) ABSTRACT

One embodiment relates to an apparatus for generating a dual-energy electron beam. A first electron beam source is configured to generate a lower-energy electron beam, and a second electron beam source is configured to generate a higher-energy electron beam. A holey mirror is biased to reflect the lower-energy electron beam. The holey mirror also includes an opening therein through which passes the higher-energy electron beam, thereby forming the dual-energy electron beam. A prism array combiner introduces a first dispersion between the lower-energy electron beam and the higher-energy electron beam within the dual-energy electron beam. A prism array separator is configured to separate the dual-energy electron beam traveling to a substrate from a scattered electron beam traveling away from the substrate. The prism array separator introduces a second dispersion which compensates for the dispersion of the prism array combiner. Other embodiments are also disclosed.

16 Claims, 6 Drawing Sheets

200

400

HOLEY MIRROR ARRANGEMENT FOR DUAL-ENERGY E-BEAM INSPECTOR

CROSS-REFERENCE TO RELATED APPLICATIONS

The present invention claims the benefit of U.S. Provisional Patent Application No. 60/705,312, entitled "Holey Mirror Arrangement for Dual-Energy E-Beam Inspector," filed Aug. 3, 2005 by inventors Marian Mankos and Eric Munro, the disclosure of which is hereby incorporated by reference.

GOVERNMENT LICENSE RIGHTS

The U.S. Government has a paid-up license in this invention and the right in limited circumstances to require the patent owner to license others on reasonable terms as provided for by the terms of Contract No. DAAD 19-00-3-1001 awarded by the U.S. Army Research Laboratory.

BACKGROUND OF THE INVENTION

1. Field of the Invention

The present invention relates generally to electron beam (e-beam) apparatus and e-beam inspection methods.

2. Description of the Background Art

Most conventional wafer and mask inspection systems use light optical images. Scanning electron beam microscopes (SEMs) have also been developed for inspection and critical dimension (CD) measurement. These SEM instruments scan a very small beam over the surface, and record the re-emitted secondary electrons in a single detector. Image acquisition tends to be slower for SEMs than for direct imaging light optical instruments because only one image element (pixel) at a time is recorded.

A low energy emission microscope (LEEM) is a direct imaging (as opposed to scanning) electron microscope. A conventional LEEM uses a single illumination beam which is accelerated typically to about 10 to 30 keV in an electron gun. The single beam passes through a separator magnet that bends the beam into the axis of the objective lens. An image of the gun crossover is transferred to the back focal (diffraction) plane of the objective lens, forming a parallel flood beam that uniformly illuminates the substrate. The substrate is electrically floated at approximately the same voltage as the cathode of the electron gun, so that illuminating electrons are decelerated in the objective lens, striking the substrate at energies typically between 0 to about 1000 eV. Some examples of prior art LEEM systems are described in the review paper: "The continuing development of the low energy electron microscope for characterizing surfaces," L. Veneklasen, Rev. Sci. Inst. 63(12) p. 5513 (December 1992) and its references.

Insulating surfaces are generally not a problem for light optical inspection because the scattering and reflection of light is insensitive to electrostatic surface charge. Unfortunately, surface charging effects can pose a difficulty for electron beam imaging of insulating surfaces (whether scanned or direct imaging). The rate that a given pixel element charges depends upon the difference between electron flux arriving at and leaving each pixel. The high current densities required for imaging at inspection rates imply a likely high rate of charging if the electron flux leaving the surface is not balanced by that entering. Thus, the surface voltage can quickly reach levels detrimental to imaging or even, in some instances, detrimental to sample integrity. Effective means for controlling local surface charging are therefore desirable if e-beam instruments are to be used for inspection of wafers, masks and other non-conductive substrates.

SUMMARY

One embodiment pertains to an apparatus for generating a dual-energy electron beam. A first electron beam source is configured to generate a lower-energy electron beam, and a second electron beam source is configured to generate a higher-energy electron beam. A holey mirror is biased to reflect the lower-energy electron beam. The holey mirror also includes an opening therein through which passes the higher-energy electron beam, thereby forming the dual-energy electron beam. A prism array combiner introduces a first dispersion between the lower-energy electron beam and the higher-energy electron beam within the dual-energy electron beam. A prism array separator is configured to separate the dual-energy electron beam traveling to a substrate from a scattered electron beam traveling away from the substrate. The prism array separator introduces a second dispersion which compensates for the dispersion of the prism array combiner.

Another embodiment pertains to a method for generating a dual-energy electron beam. A lower-energy electron beam and a higher-energy electron beam are generated. The lower-energy electron beam is reflected by a holey mirror arrangement. The higher-energy electron beam is injected through an opening in the holey mirror arrangement, thereby forming the dual-energy electron beam. The dual-energy electron beam is first deflected in a way that introduces a first dispersion between the lower-energy electron beam and the higher-energy electron beam within the dual-energy electron beam. The dual-energy electron beam is deflected a second time in a way that introduces a second dispersion to compensate for the first dispersion.

Another embodiment pertains to an automated substrate inspection system. The system includes: means for generating a lower-energy electron beam; means for generating a higher-energy electron beam; means for reflecting the lower-energy electron beam by a holey mirror arrangement; and means for injecting the higher-energy electron beam through an opening in the holey mirror arrangement, thereby forming the dual-energy electron beam.

Other embodiments are also disclosed.

DETAILED DESCRIPTION

Two Electron Guns with Inclined Beam Axes

Figure 1:
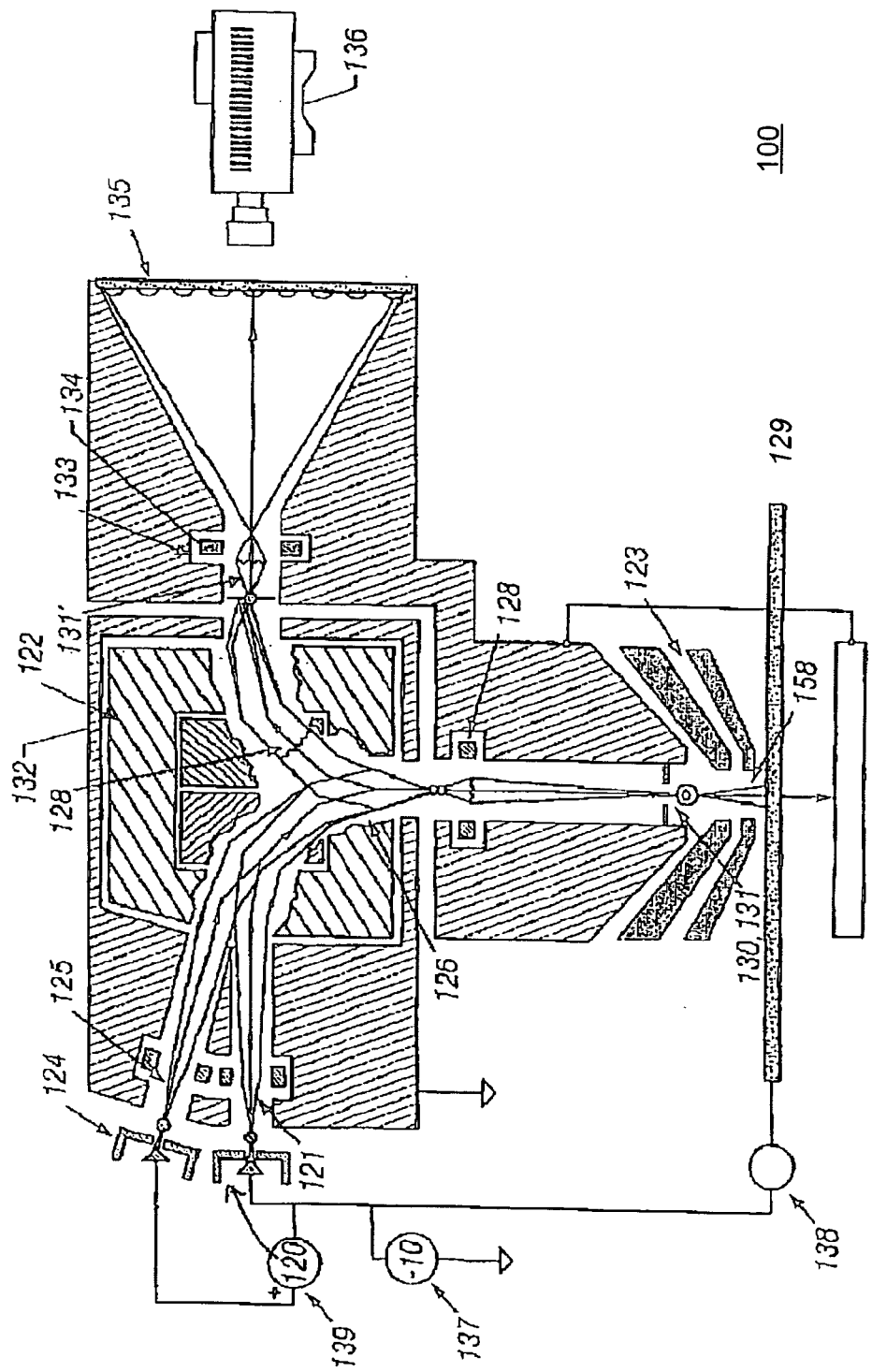
FIG. 1 is a diagram depicting a first prior structure for an electron beam apparatus having two illuminating beams.

FIG. 1 is a diagram depicting a structure for a first prior e-beam apparatus 100 having two illuminating beams. This prior apparatus 100 is described in International Publication Number WO 01/88514 A1, "Apparatus for Inspection of Semiconductor Wafers and Masks Using a Low Energy Electron Microscope with Two Illuminating Beams," applicant KLA-Tencor Corporation, inventors Lee Veneklasen, David L. Adler, and Matthew Marcus, published Nov. 22, 2001.

In this prior apparatus 100, a first electron gun 120 generates a low energy beam 121, and a second electron gun 124 generates a higher energy beam 125. The electron gun 120 for the low energy beam 121 inserts this beam into the illumination portion of a magnetic separator 122, where it is bent into the axis of the cathode (objective) lens 123. The second gun 124 is located slightly above and behind the low energy gun 120. Since its energy is somewhat higher, the beam 125 from the second gun 124 is bent through a smaller angle in the separator 122, allowing the two beam paths 126 to be superimposed where they enter the cathode lens 123. Either by accurate positioning, or with the help of auxiliary condenser lenses 128, the crossovers from both guns are imaged at their appropriate places 130 and 131 within the cathode lens 123. Within the cathode lens 123, the two beams are decelerated and collimated to form coincident and parallel flood beams 158 that illuminate the substrate 129.

Higher energy backscattered and secondary electrons, along with low energy reflected electrons, are re-accelerated and focused in the cathode lens 123, passing back upwards through the imaging portion of the magnetic separator 122, where they are bent 128 into the axis of the imaging system.

Figure 2:
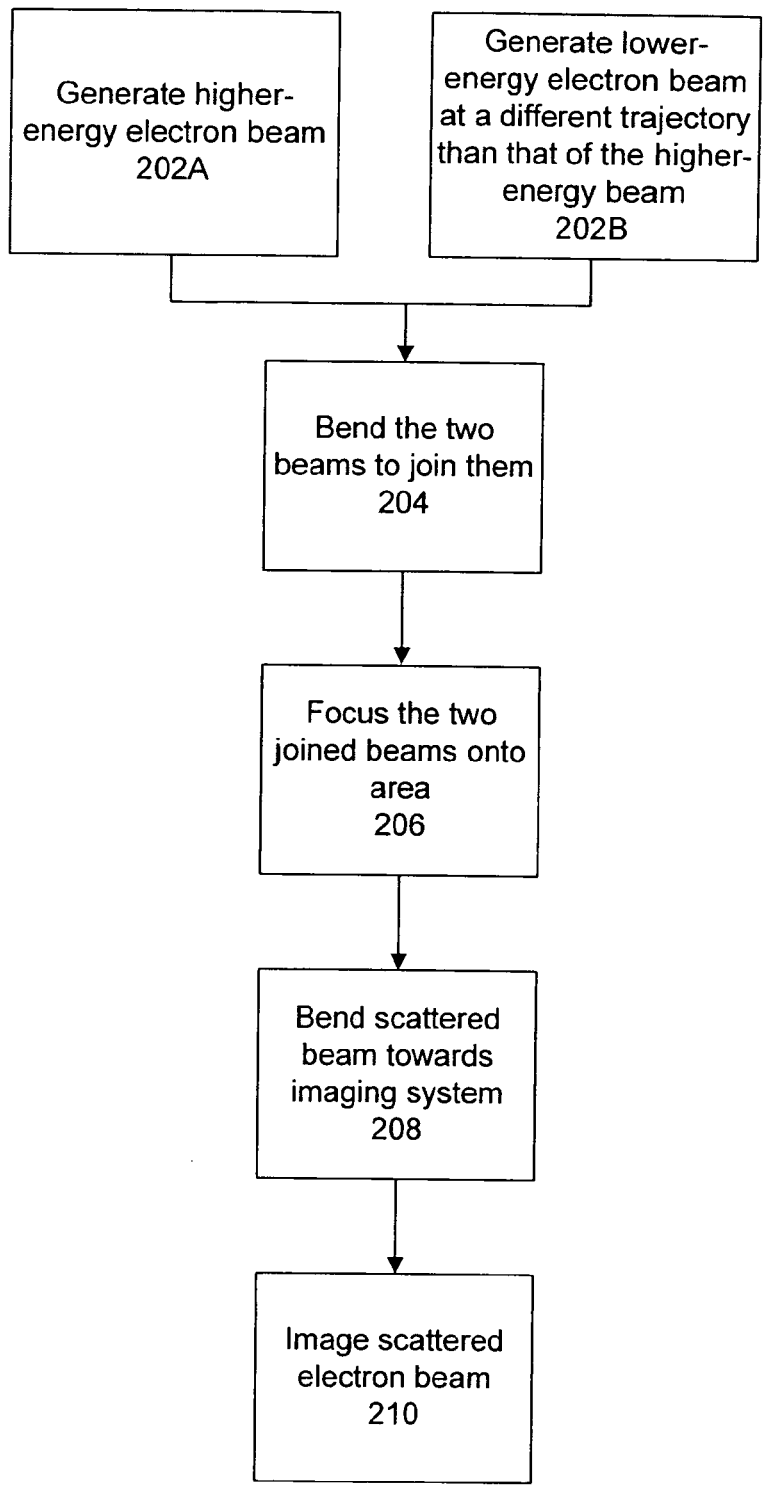
FIG. 2 is a flow chart depicting a first prior method for in-line inspection of a substrate using two illuminating beams.

FIG. 2 is a flow chart depicting a first prior method 200 for in-line inspection of a substrate using two illuminating beams. This prior method 200 may use the prior structure 100 described above in relation to FIG. 1.

A higher-energy e-beam is generated 202A by a first electron gun. Separately, a low-energy beam is generated 202B by a different gun at a different trajectory. The two beams are bent 204 to join them. This is done by a magnetic separator bending the higher-energy beam at less of an angle in comparison to its bending of the low-energy beam. As such, the two beams can be made to be superimposed upon each other. Using the cathode lens(es), the beams are focused 206 (and decelerated and collimated) onto an area of the substrate.

Scattered electrons generated by the impingement of the beams onto the area are directed (i.e. bent) 208 by the magnetic separator to separate them from the low and higher energy electron beams. The scattered beam is bent away from the illumination system and instead towards the projection system. The separation occurs because, within the separator, the scattered electrons have velocity vectors away from the substrate, while the incident electrons have velocity vectors towards the substrate. Finally, the scattered electron beam is imaged 210 to view the illuminated area.

As describe above, the prior apparatus 100 and method 200 use two co-planar guns of different beam energies and inclined beam axes. The guns are configured such that the angle of inclination is equal to the difference in deflection angles caused by the magnetic prism separator. However, this prior technique is disadvantageous in some aspects. For example, it requires biasing of the magnetic prism separator at high voltage in order to achieve sufficient angular separation of the low and high energy beams. This complicates the design and increases the likelihood of high-voltage arcing. Further, the two electron guns must be implemented in close proximity to each other, which makes the design more difficult to implement. The new method and apparatus described below overcomes these disadvantages.

Dual-Beam Electron Gun

Figure 3:
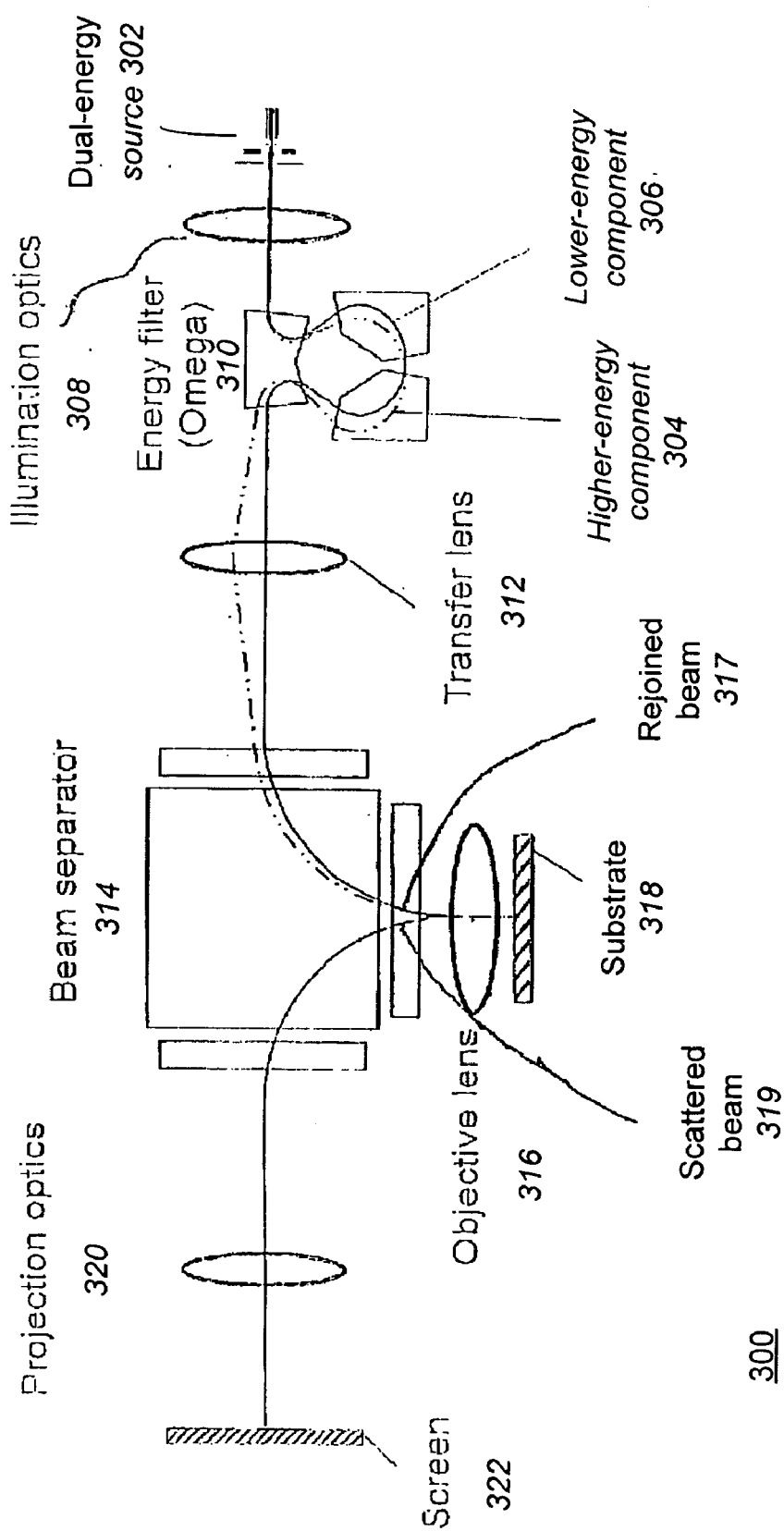
FIG. 3 is a diagram depicting a second prior structure for an electron beam apparatus having two illuminating beams.

FIG. 3 is a diagram depicting a second structure for an electron beam apparatus having two illuminating beams. This prior apparatus 300 is disclosed in U.S. Pat. No. 6,803,571, "Method and Apparatus for Dual-Energy E-Beam Inspector," issued Oct. 12, 2004 to Marion Mankos and David L. Adler.

As shown in FIG. 3, the apparatus 300 includes a dual-energy electron source 302. This dual-energy e-beam source 302 may comprise a dual-energy electron gun that is configured to generate both a higher-energy e-beam component 304 and a lower-energy e-beam component 306. In one implementation, the dual-energy e-beam source 302 is composed of two concentric cathodes, an inner disc and an outer annulus. The inner disc may be biased at a high negative voltage with respect to the substrate, while the outer annulus may be biased by an additional negative voltage with respect to the inner disc. For example, the outer annulus may be biased at several hundred volts more negative than the inner disc.

The dual-energy beam is received by illumination optics 308. After the illumination optics, the dual-energy beam enters an energy filter 310. The energy filter 310 operates as an energy-dependent dispersive device. For example, the energy filter may comprise an omega (magnetic) type energy filter. Alternatively, it may comprise an alpha (magnetic) type energy filter. The energy filter 310 introduces dispersion between the lower energy and higher energy components of the e-beam, such that the two e-beam components exit the filter 310 at different angles of trajectory. As illustrated, the higher-energy component 304 may exit the filter 310 inclined at an angle to the optical axis while the lower-energy component 306 exits the filter 310 along the optical axis. In one implementation, the asymptotic object plane of the energy filter 310 is located at the exit plane of the illumination optics 308, and the energy filter 310 forms an asymptotic image that is then transferred into the object plane of the beam separator 314 using a transfer lens 312. The energy filter 310 may, for example, be configured to be operated in a unity magnification mode for ease of implementation.

The beam separator 314 is configured to receive the two dispersed e-beam components and bend the trajectories of the components. The trajectories are bent so as to substantially cancel the dispersion previously introduced by the energy filter 310. As a result, the two e-beam components are rejoined in trajectory as they exit the beam separator 314 and enter the objective lens 316 coaxially.

Because the dispersion previously introduced between the two components is relatively small, less deflection is needed within the beam separator 314 to converge the two components. In comparison, due to the use of two separate guns, greater deflection is needed within the beam separator 122 of the prior apparatus 100. Hence, the beam separator 314 may comprise a more conventional magnetic prism array. For example, the beam separator 314 may be implemented as a compact, double-focusing magnetic prism array that generates uniform magnetic fields of different strength and lengths using grounded pole pieces and without high voltages. (You may want to refer to our prism patent here).

The objective lens 316 is configured to focus the rejoined beam 317 onto an area of the substrate 318. For example, the substrate 318 may comprise a semiconductor wafer being inspected. The substrate 318 may be electrically floated at approximately the same voltage as one of the cathodes of the source 302, such that the illuminating electrons are decelerated prior to impinging upon the substrate 318.

When the substrate surface is biased slightly more positive than the lower-energy source cathode, impingement of each of the two e-beam components onto the area of the substrate 318 generates a scattered beam 319. The beam 319 includes reflected electrons from the low energy beam 306 and secondary and backscattered electrons generated by the higher energy beam 304. The low energy beam 304 charges the surface negatively, while the high energy beam 304 charges the sample positively, resulting in dynamic charge equilibrium at the surface. The beam 319, containing both the low energy reflected mirror electrons as well as higher energy secondary and backscattered electrons, can be utilized for imaging in two implementations.

In one implementation, electrons generated by the higher-energy component 304 are utilized for imaging, and reflected electrons of the lower-energy component 306 are removed by an aperture. As such, impingement of electrons of the higher-energy component 306 onto the substrate 318 results in a secondary imaging mode where secondary or backscattered electrons make up the scattered beam 319. Such a imaging mode result in images displaying high materials contrast.

In an alternate implementation, the reflected electrons of the lower-energy component 306 are utilized for imaging, while the higher-energy component 304 is removed by an aperture. As such, impingement of electrons of the lower-energy component 206 onto the substrate 318 results in a mirror imaging mode where reflected electrons make up the scattered beam 319. Such a mirror imaging mode result in intense, high contrast images of substrate topography. The electrons of the scattered beam 319 (whether composed of backscattered, secondary, or reflected electrons) are accelerated and focused by the objective lens 316. The scattered beam 319 passes back upwards through the beam separator 314. The beam separator 314 is configured to separate the scattered beam 319 from the incident (rejoined) beam 317 by bending the scattered beam 319 towards the axis of the projection optics 320. The projection optics 320 is configured to image the scattered e-beam 319 onto a screen (or array of detectors) 322.

Figure 4:
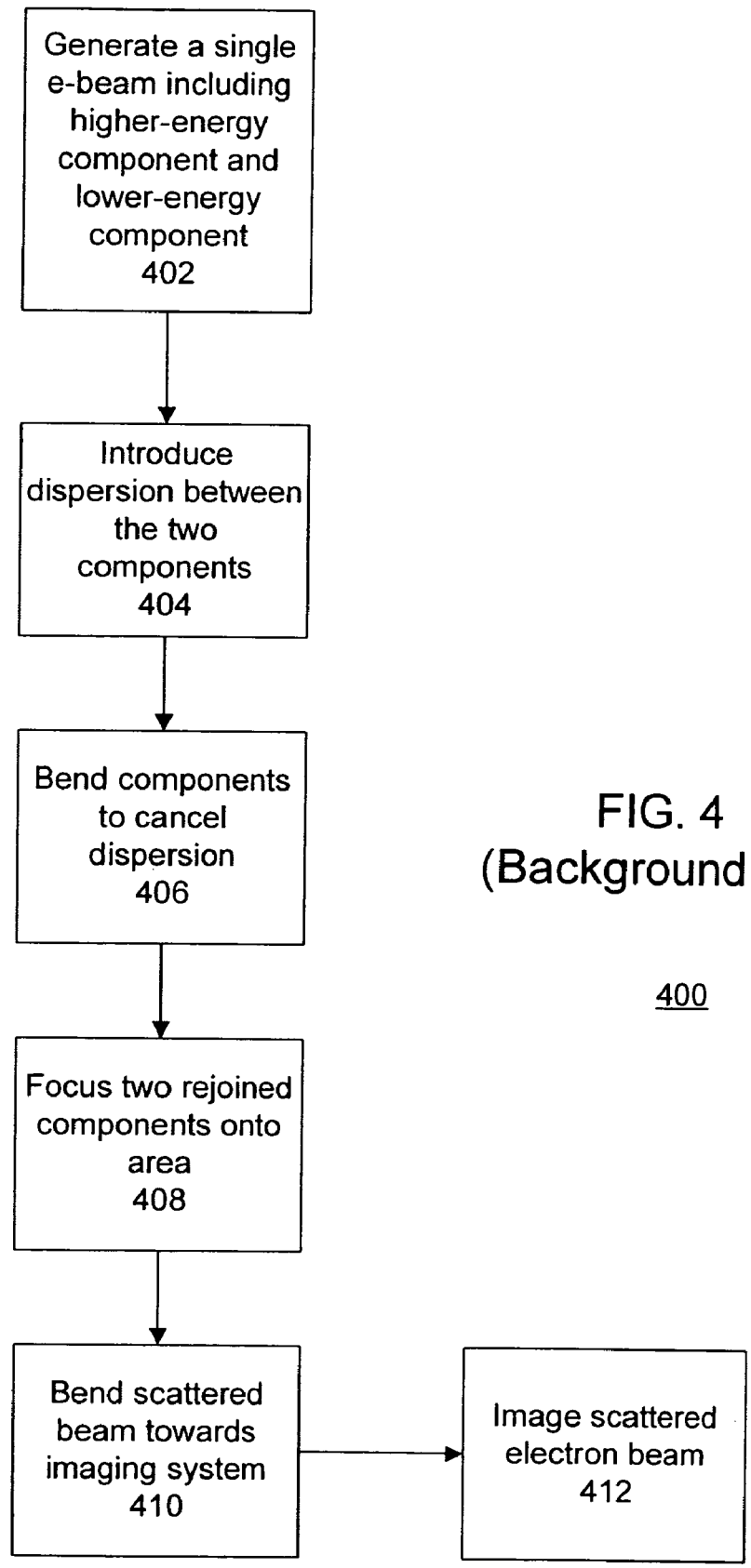
FIG. 4 is a flow chart depicting a second prior method for in-line inspection of a substrate using two illuminating beams.

FIG. 4 is a flow chart depicting a second prior method 400 for in-line inspection of a substrate using two illuminating beams in accordance with an embodiment of the invention. This prior method 400 may use the prior structure 300 described above in relation to FIG. 3.

A single dual-energy e-beam is generated 402 by a dual-energy electron gun. Dual-energy e-beam includes a higher-energy e-beam component and a lower-energy e-beam component. Both components have the same coaxial trajectory so that they make up a single beam.

Dispersion is then introduced 404 between the two beam components. The dispersion may be introduced by, for example, an energy filter. The two components enter the energy filter along the same trajectory, but they leave the energy filter with different angles of trajectory.

The two dispersed components are bent 406 to substantially cancel out the dispersion and rejoin the components into a single beam. This may be done by a beam separator bending the higher-energy beam at slightly less of an angle in comparison to its bending of the low-energy beam. As such, the two components can be rejoined coaxially (i.e. once again be superimposed upon each other). Using the objective lens, the single beam (with two rejoined components) is focused 408 (and decelerated and collimated) onto an area of the substrate.

Impingement of the rejoined e-beam components onto the substrate area generates scattered electrons. In one embodiment, impingement of the higher-energy component onto the area generates secondary electrons (approximately 1 to 30 eV energy) and/or backscattered electrons (approximately 30 to few 100 eV energy), and impingement of the lower-energy component provides electrons to compensate for unwanted surface charging. In an alternate embodiment, impingement of electrons of the lower-energy component onto the area generates reflected electrons, and electrons of the higher-energy component are utilized to supply some positive surface charging by ejecting electrons with a yield greater than unity.

The scattered electrons (whether backscattered electrons, secondary electrons, or reflected electrons) are deflected (i.e. bent) 410 by the beam separator to separate them from the low and higher energy illumination electron beams. The scattered beam is deflected away from the illumination system and instead towards the projection system. The separation occurs because, within the separator, the scattered electrons have velocity vectors away from the substrate, while the incident electrons have velocity vectors towards the substrate. Finally, the scattered electron beam is imaged 412 to view the illuminated area. The image data may be used, for example, for inspecting a semiconductor wafer.

Holey Mirror Arrangement

While the above discussed prior apparatus and methods provide dual-energy electron beams, improved apparatus and methods for providing dual-energy electron beams are desirable. One distinct technique for generating a dual-energy e-beam is disclosed herein and discussed below. This technique utilizes a holey mirror arrangement.

Unlike the prior technique using two inclined beams discussed above in relation to FIGS. 1 and 2, the presently disclosed apparatus and method does not necessarily require biasing of the separator at high voltage in order to achieve sufficient angular separation of the low and high energy beams. In addition, the presently disclosed technique does not require two electron guns to be in close proximity to each other.

Unlike the prior technique using a dual-beam gun discussed above in relation to FIGS. 3 and 4, the presently disclosed apparatus and method does not require the use of a relatively complex dual-beam gun. Such a dual-beam gun may result in a complex gun design (for example, one having two concentric cathodes at different potentials and temperatures) which may reduce reliability and stability.

Figure 5:
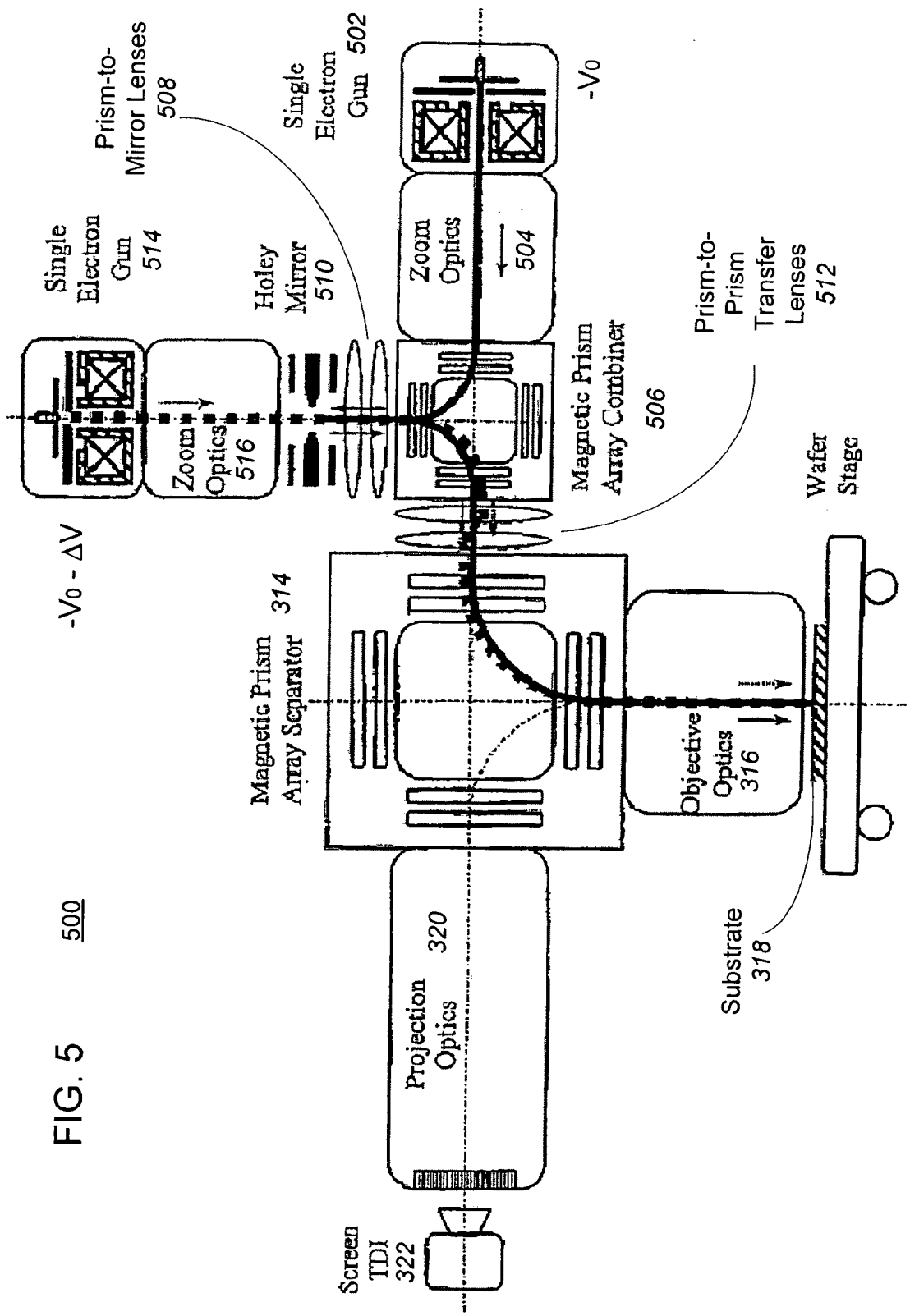
FIG. 5 is a diagram depicting a structure for an electron beam apparatus having two illuminating beams in accordance with an embodiment of the invention.

FIG. 5 is a diagram depicting a structure for an electron beam apparatus 500 having two illuminating beams in accordance with an embodiment of the invention. Such an apparatus 500 may be used to improve performance of electron inspection systems with parallel imaging of insulating and semiconductor substrates using a magnetic immersion objective lens.

As shown in FIG. 5, the apparatus 500 includes four portions or sections: an illumination configuration; an objective lens configuration; a projection configuration; and a beam separator. Compared with the apparatus 300 of FIG. 3, the apparatus 500 of FIG. 5 includes a substantially modified illumination configuration.

The illumination configuration of FIG. 5 includes two perpendicular branches which are connected by a magnetic prism array combiner 506. The first branch includes a first electron gun or source 502 at a first (lower) potential energy U, along with zoom optics 504. The second branch includes a second electron gun or source 514 at a second (higher) potential energy U+dU, along with zoom optics 516. The second branch also includes an array-to-mirror lens configuration 508, and a holey mirror arrangement 510.

The magnetic prism array combiner 506 may be implemented as a compact, double focusing magnetic prism array which forms uniform magnetic fields of different strength and length. For example, see U.S. Pat. No. 6,878,937, "Prism Array for Electron Beam Inspection and Defect Review," issued Apr. 12, 2005 to Marion Mankos, the disclosure of which is hereby incorporated by reference. The magnetic prism array combiner 506 is configured so as to make co-axial the two electron beams emitted from the two spatially separated beam guns (502 and 514).

The first electron gun 502 is biased at a high negative potential of $V_1=-V_0$ so as to generate a first electron beam (solid line in FIG. 5) of relatively lower energy. As shown in FIG. 5, the first gun 502 may be located along the horizontal microscope axis formed by the illumination and projection optics. After the illumination zoom optics 504, the lower-energy beam passes through the magnetic prism array combiner, which deflects this beam by ninety degrees (or approximately ninety degrees) into the prism-to-mirror lenses 508 which focus the beam onto the holey mirror arrangement 510.

The holey mirror 510 may be implemented as an electrostatic lens or mirror which is biased slightly more negatively than the first gun 502. For example, the holey mirror 510 may be biased to be at $V_{mirror}=-V_0-dV$. Because of the more negative bias of the holey mirror 510 relative to the bias of the first gun 502, the holey mirror 510 reflects or repels the first electron beam back through the prism-to-mirror lenses 508, so that the first electron beam enters into the magnetic prism array combiner 506.

In addition, the second electron gun 514, positioned along the vertical axis of the prism array combiner 506, is biased more negatively than the holey mirror 510 so as to generate a second electron beam (dashed line in FIG. 5) at relatively higher energy. In other words, the second electron gun 514 may be biased at a high negative voltage of $V_2=-V_0-\Delta V$, where $\Delta V$ is larger than dV. For example, $\Delta V$ may be a few hundred volts. Since the second electron gun 514 is biased more negatively than the holey mirror 510, the second electron beam, after the zoom optics 516, passes through the hole or opening of the holey mirror 510 and becomes co-axial with the first, lower energy beam. The second beam is injected into the magnetic prism array combiner 506 in a co-axial manner with respect to the first beam.

The magnetic prism array combiner 506 deflects both the first and second electron beams by approximately ninety degrees so that their trajectories are back approximately along the horizontal microscope axis. However, because the second electron beam has a relatively higher energy and hence a relatively higher velocity than the first electron beam, the second electron beam (dashed line) is deflected less (i.e. is bent less) than the first electron beam (solid line) by the magnetic prism array combiner 506. For example, as shown in FIG. 5, the first beam (solid line, lower energy) may be deflected by 90 degrees to be parallel with the horizontal microscope axis while the second beam (dashed line, higher energy) may be deflected by slightly less than 90 degrees to be almost (but not quite) parallel to the horizontal microscope axis.

The prism-to-prism transfer lenses 512 are configured to change the trajectory of one or both electron beams before the beams enter the magnetic prism array separator (beam separator) 314. For example, as shown in FIG. 5, the trajectory of the second electron beam (dashed line, higher energy) may be changed so that the second electron beam enters the beam separator 314 at an inclined angle relative to the horizontal microscope axis.

The beam separator 314 may comprise, for example, a compact, double focusing magnetic prism array which provides uniform magnetic fields of different strength and length so as to provide a mechanism for stigmatic focusing and also enables the prism array to behave as a round lens. The round lens type behavior greatly simplifies set-up, alignment and operation of the apparatus. The beam separator 314 may be configured to deflect the first and second electron beams such that they are co-axial after they emerge from the beam separator 314 (as they enter the objective optics 316). For example, as shown in FIG. 5, the first beam (solid line, lower energy) may be deflected by 90 degrees, and the second beam (dashed line, higher energy) may be deflected by slightly less than 90 degrees such that both beams end up with trajectories that are parallel with the vertical axis of the beam separator 314.

In a preferred embodiment, the prism array combiner 506 and the prism array separator 314 have identical or near identical dispersions. In addition, the prism-to-prism transfer lenses 512 preferably operates as a unity magnification transfer lens.

Thereafter, the apparatus 500 operates in a same or similar manner as the apparatus 300 discussed above in relation to FIG. 3. The angular difference in the trajectories of the first and second beams going into the array separator 314 may be configured such that both beams exit the array separator 314 (and enter the objective optics 316) at a same (co-axial) trajectory. After the beam is deflected into the objective optics 316, the electrons are decelerated and focused by the objective lens. The electrons are scattered by the substrate 318, thus forming a two-dimensional image. This image from the scattered electrons is then refocused by the objective lens and deflected by the beam separator 318 into the projection optics 320, which magnifies the image for detection and display on a viewing screen. The detection may be performed by a TDI detector or other detection system.

Figure 6:
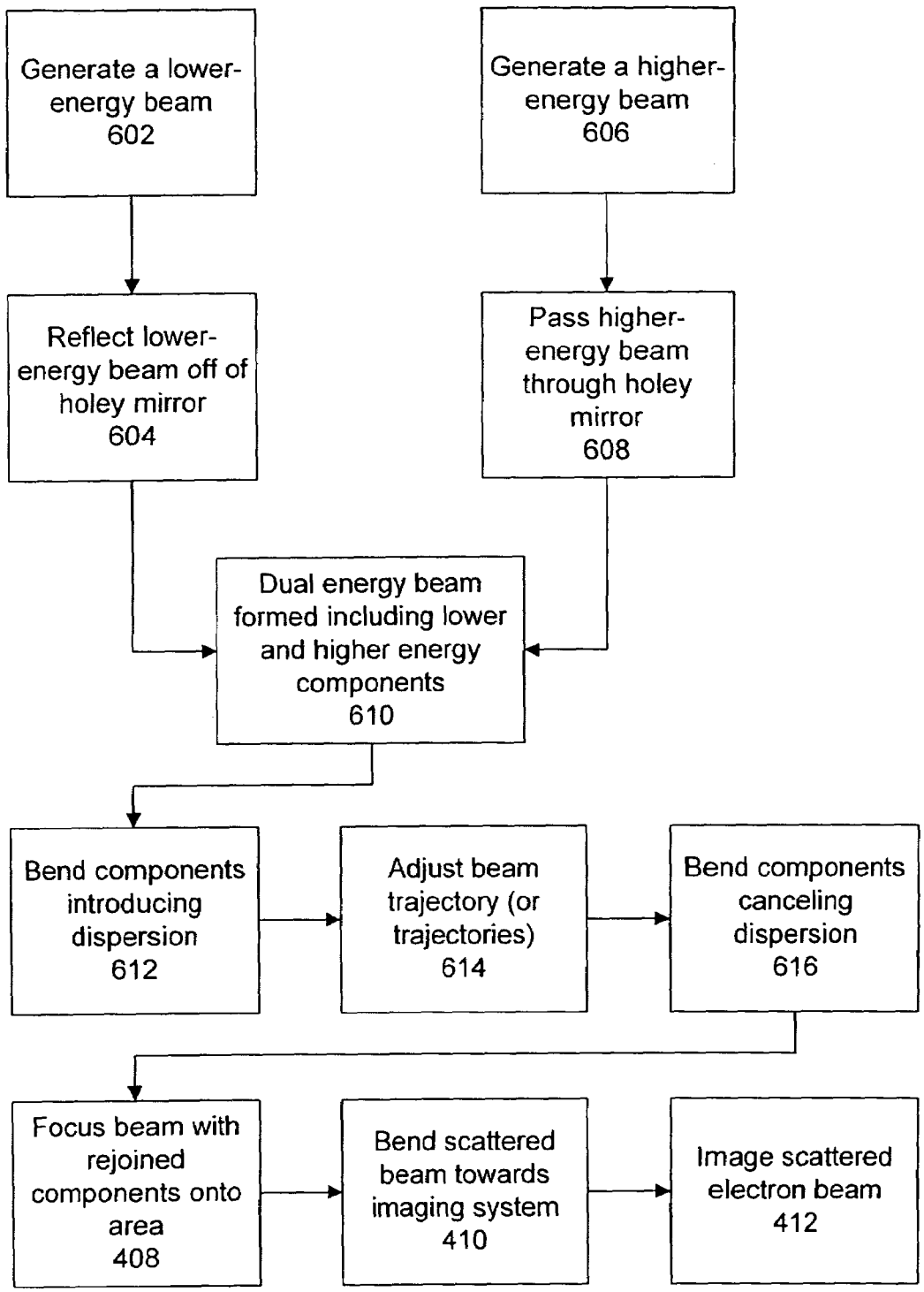
FIG. 6 is a flow chart depicting a method for in-line inspection of a substrate using two illuminating beams in accordance with an embodiment of the invention.

FIG. 6 is a flow chart depicting a method 600 for in-line inspection of a substrate using two illuminating beams in accordance with an embodiment of the invention. This method 600 may use the structure 500 described above in relation to FIG. 5.

A lower-energy electron beam is generated 602 by a first electron gun, and a higher-energy electron beam is generated 606 by a second (separate) electron gun. The lower-energy e-beam is reflected 604 off of the holey mirror, while the higher-energy e-beam is passed 608 through an opening in the holey mirror. In this way, a dual-energy e-beam is formed 610 including lower and higher energy components.

The lower and higher energy components are deflected or bent 612 by the prism array combiner 506. During this deflection 612, dispersion is introduced between the two beam components. In other words, the two components enter the prism array combiner 506 along the same trajectory, but they leave the prism array combiner 506 with different angles of trajectory.

A prism-to-prism transfer lens 512 may then be used to adjust 614 the trajectory of one or more of the beam components. Thereafter, the two dispersed components may be deflected or bent 616 to substantially cancel out the dispersion and rejoin the components into a single co-axial beam. This may be done by a beam separator 314 bending the higher-energy beam at slightly less of an angle in comparison to its bending of the low-energy beam. As such, the two components can be rejoined coaxially (i.e. once again be superimposed upon each other).

Thereafter, the method 600 of FIG. 6 follows the same or similar steps as the method 400 described above in relation to FIG. 4. Using the objective lens, the single beam (with two rejoined higher and lower energy components) is then focused 408 (and decelerated and collimated) onto an area of the substrate. Impingement of the rejoined e-beam components onto the substrate area generates scattered electrons. In one embodiment, impingement of the higher-energy component onto the area generates secondary electrons (approximately 1 to 30 eV energy) and/or backscattered electrons (approximately 30 to few 100 eV energy), and impingement of the lower-energy component provides electrons to compensate for unwanted surface charging. In an alternate embodiment, impingement of electrons of the lower-energy component onto the area generates reflected electrons, and electrons of the higher-energy component are utilized to supply some positive surface charging by ejecting electrons with a yield greater than unity.

The scattered electrons (whether backscattered electrons, secondary electrons, or reflected electrons) are deflected (i.e. bent) 410 by the beam separator to separate them from the low and higher energy illumination electron beams. The scattered beam is deflected away from the illumination system and instead towards the projection system. The separation occurs because, within the separator, the scattered electrons have velocity vectors away from the substrate, while the incident electrons have velocity vectors towards the substrate. Finally, the scattered electron beam is imaged 412 to view the illuminated area. The image data may be used, for example, for inspecting a semiconductor wafer.

Advantageously, the above-disclosed technique allows the use of two conventional single beam electron guns to create a dual-energy beam for use in inspection and other applications. The use of two conventional single beam guns simplifies the gun design and should improve reliability. This technique also enables the energy difference between the two beam so be varied over a range of a few hundred volts or so, while the previous techniques typically require a more significant design change to accommodate different gun biases.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for generating a dual-energy electron beam, the apparatus comprising:
    a first electron beam source configured to generate a lower-energy electron beam;
    a second electron beam source configured to generate a higher-energy electron beam;
    a holey mirror biased to reflect the lower-energy electron beam and including an opening therein through which passes the higher-energy electron beam, thereby forming the dual-energy electron beam;
    a prism array combiner introducing a first dispersion between the lower-energy electron beam and the higher-energy electron beam within the dual-energy electron beam; and
    a prism array separator configured to separate the dual-energy electron beam traveling to a substrate from a scattered electron beam traveling away from the substrate, wherein the prism array separator introduces a second dispersion which compensates for the dispersion of the prism array combiner.

2. The apparatus of claim 1, wherein the prism array combiner and the prism array separator each deflects the lower-energy beam by ninety degrees and the higher-energy beam by slightly less than ninety degrees.

3. The apparatus of claim 1, further comprising:
    a transfer lens arrangement positioned between the prism array separator and the prism array combiner and configured to change a trajectory of at least one of the electron beams.

4. The apparatus of claim 3, wherein the transfer lens arrangement has a unity magnification effect on the electron beams.

5. The apparatus of claim 1, wherein the first electron source is biased at a less negative voltage than the holey mirror is biased.

6. The apparatus of claim 5, wherein the second electron source is biased at a more negative voltage than the holey mirror is biased.

7. The apparatus of claim 1, further comprising:
    an objective lens configured to focus the dual-energy electron beam onto a two-dimensional area of a substrate being inspected.

8. A method for generating a dual-energy electron beam, the method comprising:
    generating a lower-energy electron beam;
    generating a higher-energy electron beam;
    reflecting the lower-energy electron beam by a holey mirror arrangement; and
    injecting the higher-energy electron beam through an opening in the holey mirror arrangement, thereby forming the dual-energy electron beam;
    a first deflection of the dual-energy electron beam in a way that introduces a first dispersion between the lower-energy electron beam and the higher-energy electron beam within the dual-energy electron beam; and
    a second deflection of the dual-energy electron beam in a way that introduces a second dispersion to compensate for the first dispersion.

9. The method of claim 8, wherein each said deflection deflects the lower-energy beam by ninety degrees and the higher-energy beam by slightly less than ninety degrees.

10. The method of claim 9, further comprising:
    changing a trajectory of at least one of the electron beams in between the first and second deflections.

11. The method of claim 10, wherein the trajectory is changed using a lens arrangement with unity magnification effect.

12. The apparatus of claim 8, wherein the lower-energy beam is reflected by the holey mirror arrangement because of a slightly less negative voltage bias at an electron source of the lower-energy beam in comparison to a voltage bias at the holey mirror arrangement.

13. The apparatus of claim 12, wherein the higher-energy beam passes through the opening in the holey mirror arrangement because of a more negative voltage bias at an electron source of the higher-energy beam in comparison to the voltage bias at the holey mirror arrangement.

14. The method of claim 8, further comprising:
focusing by an objective lens of the dual-energy electron beam onto a two-dimensional area of a substrate being inspected.

15. An automated substrate inspection system, the system comprising:

means for generating a lower-energy electron beam;

means for generating a higher-energy electron beam;

means for reflecting the lower-energy electron beam by a holey mirror arrangement; and means for injecting the higher-energy electron beam through an opening in the holey mirror arrangement, thereby forming the dual-energy electron beam.

16. The system of claim 15, further comprising:

means for deflecting the dual-energy electron beam in a way that introduces a first dispersion between the lower-energy electron beam and the higher-energy electron beam within the dual-energy electron beam; and means for deflecting the dual-energy electron beam in a way that introduces a second dispersion to compensate for the first dispersion.

* * * * *